Feb. 20, 1968 E. F. CAVE 3,370,204

COMPOSITE INSULATOR-SEMICONDUCTOR WAFER

Original Filed June 28, 1963

INVENTOR:-
ERIC F. CAVE

BY [signature]

Attorney

United States Patent Office 3,370,204

Patented Feb. 20, 1968

3,370,204
COMPOSITE INSULATOR-SEMICONDUCTOR WAFER

Eric F. Cave, Somerville, N.J., assignor to Radio Corporation of America, a corporation of Delaware Original application June 28, 1963, Ser. No. 291,338, now Patent No. 3,300,832, dated Jan. 31, 1967. Divided and this application Aug. 9, 1966, Ser. No. 571,276
5 Claims. (Cl. 317—101)

ABSTRACT OF THE DISCLOSURE

A composite wafer is made of semiconductor pieces embedded in a matrix of insulating glass. The semiconductor pieces and the glass each have a continuous common surface coincident with a surface of the wafer so that active components may be formed in the semiconductor pieces and passive components and interconnecting means may be deposited on the surface of the glass.

This is a division of my copending application, Ser. No. 291,338, filed June 28, 1963, now Patent No. 3,300,832.

This invention relates to a novel, composite, insulator-semiconductor wafer especially useful in integrated circuits.

It has been proposed to produce components of an integrated circuit on a relatively small wafer of suitably doped, single crystal, semiconductor material by diffusing one or more electron acceptor or donor elements into selected portions of the wafer. In this manner, active circuit components, such as diodes and transistors are provided. A suitable technique for making such active components is described, for example, in U.S. Patent 2,802,-760, issued on Aug. 13, 1957, to L. Derick, et al. for Oxidation of Semiconductive Surfaces for Controlled Diffusion. In some of these prior art, so-called monolithic integrated circuits, there may be a tendency for spurious signals to be produced due to parasitic interactions and/or insufficient electrical insulation between the active components in the circuit. Unwanted stray capacities and current leakages tend to increase in these monolithic circuits as the distance between the active elements is decreased. The disposition of passive elements, such as resistors and capacitors, for example, over the monolithic wafer also tends to produce the aforementioned parasitic interactions.

It is an object of the present invention to provide a novel, composite wafer for integrated circuits that tends to eliminate, or markedly reduce, the aforementioned disadvantages of integrated circuits on a monolithic wafer.

Another object of the present invention is to provide a novel, composite, insulator-semiconductor wafer for use in integrated circuit structures to reduce parasitic interactions, unwanted current leakages and spurious signals in the integrated circuits.

Still another object of the present invention is to provide a novel, composite, glass-semiconductor wafer especially arranged for supporting both passive components and active components in integrated circuits and the connections therefrom to other components of such circuits.

Still a further object of the present invention is to provide a novel, composite, insulator-semiconductor wafer of the type described that is relatively simple in construction, easy to use in integrated circuits, and highly efficient in use.

Briefly, the novel, composite, insulator-semiconductor wafer of the present invention comprises a wafer-like structure of one or more pairs of alternated members of semiconductor material and electrical insulating material, such as glass. In one form of the invention, the semiconductor members are imbedded in and are completely separated from each other by the insulating material. Active components may be produced in the portions of semiconductor material by diffusing suitable elements into the semiconductor material in accordance with known techniques. The active components may be interconnected electrically by conductors and passive components supported, at least in part, by the glass.

The novel, composite, insulator-semiconductor wafer may be manufactured, for example, by forming a relief pattern of a plurality of mesas to a predetermined depth in one surface of a single crystal of suitably doped semiconductor material. The relief pattern is covered with a sheet of glass and heated under pressure until the softened glass is forced into the relief pattern. When the glass has cooled, its surface is removed, as by grinding or lapping until the upper surface of the mesas of the semiconductor material in the relief pattern are exposed. The lower surface of the wafer of semiconductor material is also lapped until only the mesas remain separated from each other by the matrix of glass that had been pressed into the relief pattern and until a desired thickness of the composite wafer is obtained. The mesas can be operated upon, as by diffusing electron acceptor or donor elements into them, to form active components either as soon as their upper surfaces have been exposed or after the composite wafer has been reduced to its desired thickness.

The novel features of the present invention, both as to its organization and method of operation, as well as additional objects and advantages thereof, will be more readily understood from the following description, when read in connection with the accompanying drawing, in which similar reference characters designate similar parts throughout, and in which.

Figures 1, 2, 3, 4, 5, 6, 7, 8:
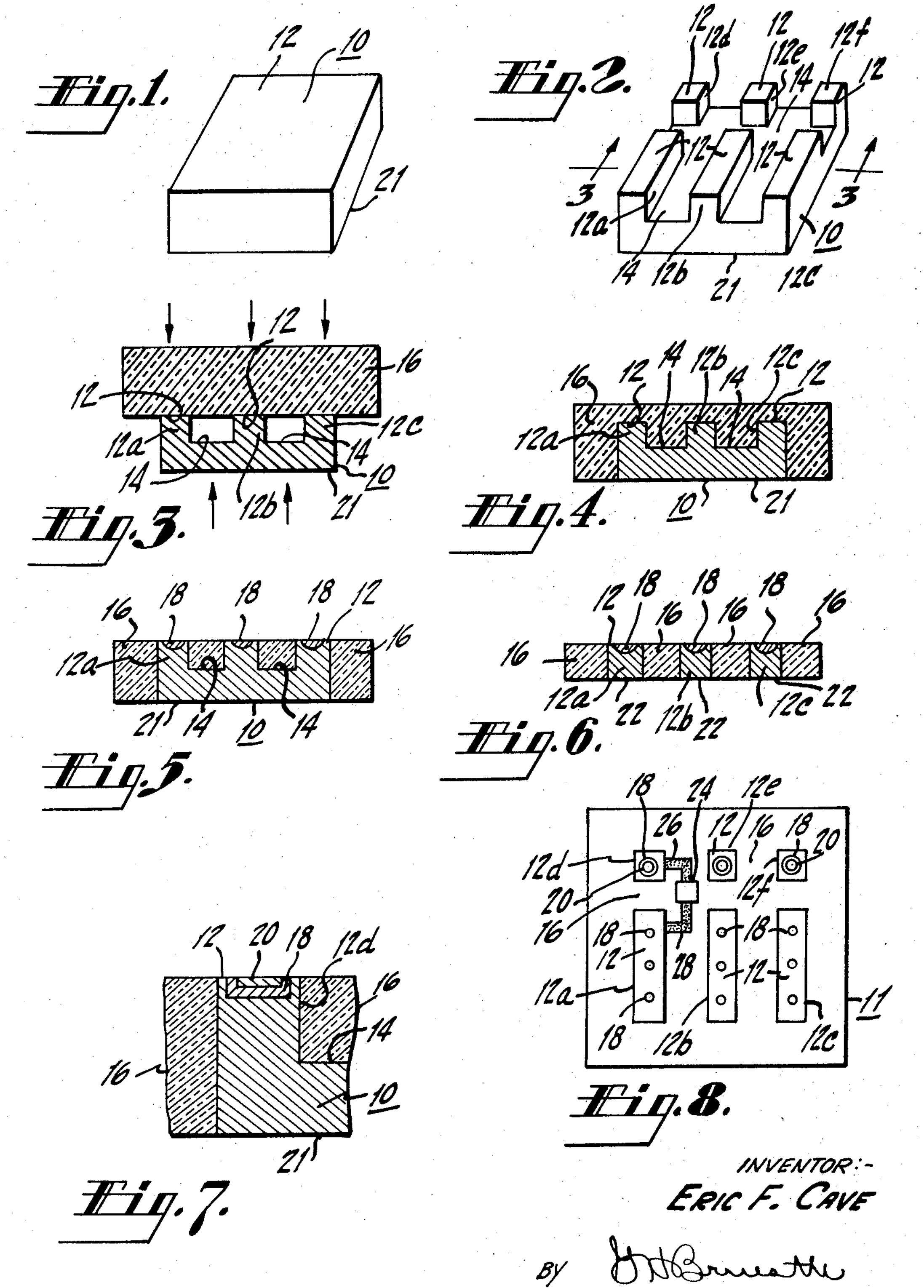
FIG. 1 is a perspective view of a wafer of semiconductor material for use in the manufacture of the novel, composite, insulator-semiconductor wafer.
FIG. 2 is a perspective view of the wafer illustrated in FIG. 1, showing a relief pattern of a plurality of mesas in the upper surface of the wafer as formed during one of the steps of a suitable method of making the novel, composite, insulator-semiconductor wafer.
FIGS. 3, 4, 5 and 6 are cross-sectional views, taken along the line 3—3 of FIG. 2, illustrating different steps in the manufacture of the novel insulator-semiconductor wafer.
FIG. 7 is an enlarged, fragmentary, cross-sectional view illustrating another of the steps in the manufacture of the novel composite, insulator-semiconductor wafer including portions of the glass insulator.
FIG. 8 is a plan view of the completed, novel, composite, insulator-semiconductor wafer.

Referring, now, particularly to FIG. 1, there is shown a wafer 10 or prismatic shape formed from a single crystal of doped semiconductor material, such as N-type or P-type germanium or silicon. Only a portion of the wafer 10 is employed in the composite, insulator-semiconductor wafer of the present invention, an example of which is illustrated by the wafer 11 in FIG. 8, to be described in greater detail hereinafter.

In a preferred method of forming the composite, insulator-semiconductor wafer 11, a relief pattern of desired configuration is formed in a portion of the wafer 10 through one of the surfaces, such as the upper surface 12, of the wafer 10. The relief pattern provides a plurality of mesas and may be formed either mechanically or chemically by any suitable methods known in the art. Thus, by the term "forming a relief pattern," as used herein, is meant the method step of either cutting, or sawing, or etching (mechanically or chemically) a surface of the wafer 10 to form a plurality of mesas therein.

Referring, now, to FIG. 2, there is shown one example of a relief pattern comprising a plurality of mesas 12*a*, 12*b*, 12*c*, 12*d*, 12*e*, and 12*f* formed in the upper surface 12 of the wafer 10 by two parallel cuts and one transverse cut. The mesas 12*a*–12*f* are formed preferably by uniform cuts to a predetermined, uniform depth, as defined by the floor 14 of the cuts in the wafer 10. The shape and size of the mesas are determined by the desired integrated circuitry to be included on the composite wafer 11. Six mesas (12*a*–12*f*) are illustrated in the drawing and described herein; however, there may be more or less than six.

The mesas 12*a*–12*f* are islands of semiconductor material that are to be separated from each other by a good electrical insulator in the composite, insulator-semiconductor wafer 11. The insulator should have a coefficient of expansion that is as near to that of the wafer 10 as possible to prevent thermal stresses between the insulator and the semiconductor material. This insulator is preferably glass 16, that has been placed over the mesas 12*a*–12*f*, as shown in FIG. 3, and heated until it has softened. The glass 16 is pressed, when softened, into the cuts in the relief pattern. The glass 16 may be Pyrex glass or a lime-alumino-silicate glass, such as #1715 glass, for example, manufactured by the Corning Glass Company. For example, a sheet of this glass 16 is placed over the relief pattern of the mesas in the surface 12 of the wafer 10, and the glass 16 and the wafer 10 are heated to a temperature between 1,100° C. and 1,200° C. by any suitable means known in the art, as by heating in an induction furnace, for example, until the glass 16 softens. Pressure is applied, as by a hydraulic press, between the glass 16 and the wafer 10, in the direction indicated by the arrows in FIG. 3, to force the softened glass into the relief pattern, that is, between the mesas, as well as over the surfaces 12, or lands, of the mesas. This results in the structure illustrated in FIG. 4. Pressures in the order of 50 to 800 p.s.i. have been found satisfactory for this purpose, depending upon the temperature and state of fusion of the glass 16. The softer the glass 16, the less pressure is needed to press the glass 16 into the relief pattern in the wafer 10.

When the glass has cooled, the upper portion (as viewed in FIG. 5) of the glass above the surface 12 of the wafer 10 is removed, that is, the glass 16 is ground, or lapped, until at least the upper surfaces 12 of the mesas 12*a*–12*f* are exposed, as shown in FIG. 5. Active electronic components, such as diodes and transistors, may now be formed in the exposed surfaces 12 of the mesas 12*a*–12*f* by any suitable techniques known in the art. Thus, by the techniques described in the aforementioned U.S. Patent 2,802,760, a plurality of diodes may be formed in the mesas 12*a*, 12*b*, and 12*c* by diffusing suitable electron donor or acceptor elements (impurities) into the exposed surfaces 12 of these mesas to establish regions 18 of conductivity type opposite to that of the wafer 10. Where, for example, the doped semiconductor material of the wafer 10 is N-type silicon, the diffused elements are P-type (electron acceptor impurity) elements, such as indium. If the semiconductor material of the wafer 10 is P-type material, the elements diffused into the surface 12 of the mesas 12*a*, 12*b*, and 12*c* would be of N-type impurity, such as arsenic.

Transistors may be formed in the mesas 12*d*, 12*e*, and 12*f*, as shown in FIGS. 7 and 8 for example, by the techniques also described in the aforementioned patent. Regions 18 are first formed by diffusing in one or more elements which will produce conductivity of a type opposite to that of the semiconductor material of the wafer 10. Then, regions 20 are formed within the regions 18 by diffusing one or more elements capable of providing conductivity of a type the same as the semiconductor material of the wafer 10. Suitable electrodes (not shown) are connected to the original semiconductor material of the wafer 10 and to the regions 18 and 20 of the semiconductor material containing the diffused elements in a manner known in the art to provide interconnecting means for the active components.

In order to isolate the mesas 12*a*–12*f* from each other completely so as to reduce the possibility of unwanted interactions between components on the different mesas, the lower portion of the wafer 10 is removed, as by grinding or lapping its lower surface 21, until at least the floor 14 of the relief pattern is removed, as shown in FIG. 6. Each of the mesas 12*a*–12*f* is now a separate island that is separated from the other mesa islands in the insulating matrix defined by the glass 16, as shown also in FIG. 8. Since the glass 16 is a much better electrical insulator than the semiconductor material of the mesas 12*a*–12*f*, the electrical isolation of these mesas, and, consequently, the electrical isolation of the active components on separate mesas, is beter than if all of the active components were on a single (monolithic) crystal of semiconductor material. If desired, the mesas may be isolated from each other before they are operated upon to convert portions of them into active components.

After the lower portion of the semiconductor wafer 10 has been removed, as by grinding or lapping, and the insulator-semiconductor wafer reduced to a desired thickness, the lower, exposed surfaces 22 of the mesas may also be operated upon to form active components therein by any known technique, if so desired.

Passive components, such as capacitors or resistors, for example, may be mounted on or applied to the glass 16 between the separated mesas 12*a*–12*f* and may be electrically connected to the mesas by conductors that are applied to the glass, as by printing or painting on the glass, in a manner known in the art. Thus, as shown in FIG. 8, a resistor 24 is connected to the mesa 12*d* by a conductor 26 which may be either "printed" or of conductive paint. The semiconductor material of the mesa 12*d* may be the collector of the transistor formed in its surface. A conductor 28, similar in composition and construction to the conductor 26, connects the resistor 24 to the mesa 12*a*. The semiconductor material of the mesa 12*a* may be the cathodes of the diodes formed in its surface. Thus, the resistor 24 may be considered to be connected between the collector of a transistor and the cathode of a diode. Because the resistor 24 and the conductors 26 and 28 are on, or over, a good electrical insulator (glass 16), the tendency for interactions to occur in an integrated circuit into which they are connected, as described above, is much less than it would be if the passive components were mounted directly on, or over, the doped semiconductor material of the wafer 10. Other passive components, and even active components, may be supported on the glass 16 and interconnected with components formed in the mesas 12*a*–12*f* by any suitable connecting means. For example, a silicon oxide insulating coating can be deposited on the semiconductor body surface except where electrical contacts are to be made within the diffused areas. This coating can be produced as described, for example, in aforementioned U.S. Patent 2,802,760. Electrical leads can then be formed on top of the silicon oxide coating by evaporating aluminum and masking out the areas where aluminum deposition is not desired. The leads can thus be caused to make contact to the semiconductor body within the diffused areas and extend over the silicon oxide coating to the surface of the glass 16.

What is claimed is:

1. A unitary, wafer-like structure capable of carrying an integrated electronic circuit network of electronic components, said structure comprising a pair of adjoining members one of which is of a semiconductor material and the other of which is of an insulator material, said members having a continuous, common, exposed surface for receiving said components.

2. A wafer-like matrix of insulating material having imbedded therein at least one piece of semiconductor material which has at least one surface thereof exposed on a surface of said matrix, at least one electronic circuit component supported by and adhering to said insulating material, and circuit connections on said insulating material extending between said semiconductor material and said component.

3. A unitary, wafer-like structure capable of carrying an integrated electronic circuit network of electronic components, said structure comprising a plurality of alternated semiconductor members and insulator members, said insulator members joining and maintaining said semiconductor members separated from each other, and said members all having a continuous, common, exposed surface for receiving said components.

4. An integrated circuit wafer structure comprising a plurality of semiconductor members spaced from each other, insulator members joining said semiconductor members and maintaining them in spaced, insulated relation to each other, said semiconductor members and said insulator members having a continuous, common surface, at least one active electronic component affixed to said common surface of one of said semiconductor members, at least one passive electronic component affixed to said common surface of one of said insulator members, and conductive means connecting said passive electronic component to at least one of said semiconductor members.

5. An integrated circuit wafer structure as defined in claim 4 wherein said conductive means is also on said common surface.

References Cited

UNITED STATES PATENTS 3,173,101 3/1965 Stelmak.
3,235,428 2/1966 Naymik.

ROBERT K. SCHAEFER, *Primary Examiner.*

J. R. SCOTT, *Assistant Examiner.*